United States Patent
Yuan et al.

(10) Patent No.: US 9,673,178 B2
(45) Date of Patent: Jun. 6, 2017

(54) METHOD OF FORMING PACKAGE STRUCTURE WITH DUMMY PADS FOR BONDING

(71) Applicant: Powertech Technology Inc., Hsinchu County (TW)

(72) Inventors: Chia-Hsiang Yuan, Hsinchu County (TW); Chia-Wei Chang, Hsinchu County (TW); Kuo-Ting Lin, Hsinchu County (TW); Yong-Cheng Chuang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 14/970,558

(22) Filed: Dec. 16, 2015

(65) Prior Publication Data

US 2017/0110439 A1    Apr. 20, 2017

(30) Foreign Application Priority Data

Oct. 15, 2015    (TW) .............................. 104133820 A (51) Int. Cl.
*H01L 25/065*    (2006.01)
*H01L 25/00*    (2006.01)
*H01L 23/00*    (2006.01)

(52) U.S. Cl.
CPC .......... *H01L 25/0657* (2013.01); *H01L 24/03* (2013.01); *H01L 24/06* (2013.01);
(Continued)

(58) Field of Classification Search
CPC ..... H01L 25/0657; H01L 25/50; H01L 24/03; H01L 24/06
See application file for complete search history.

(56) References Cited

U.S. PATENT DOCUMENTS 5,789,816 A * 8/1998 Wu ................... H01L 23/49531
257/723
6,418,029 B1    7/2002 McKee et al.
(Continued)

FOREIGN PATENT DOCUMENTS

TW    200532873        10/2005
TW    200913208 A      3/2009
(Continued)

OTHER PUBLICATIONS

"Office Action of Taiwan Counterpart Application", issued on Aug. 9, 2016, p. 1-p. 4.

*Primary Examiner* — John C Ingham
*Assistant Examiner* — Gustavo Ramallo
(74) *Attorney, Agent, or Firm* — Jianq Chyun IP Office (57) ABSTRACT

Provided is a package structure including a substrate, N dies, N first pads, N vertical wires, and a second pad. The N dies are stacked alternatively on the substrate, so as to form a multi-die stack structure. The N dies include, from bottom to top, first to $N^{th}$ dies, wherein N is an integer greater than 1. The first die is a bottom die, and the $N^{th}$ die is a top die. The first pads are disposed on an active surface of the dies respectively. The vertical wires are disposed on the first pads respectively. The second pad is disposed on the top die.

7 Claims, 8 Drawing Sheets

(52) U.S. Cl.
CPC .... *H01L 25/50* (2013.01); *H01L 2224/04042* (2013.01); *H01L 2224/06505* (2013.01); *H01L 2225/06506* (2013.01); *H01L 2225/06562* (2013.01)

(56) References Cited

U.S. PATENT DOCUMENTS

| | | |
|---|---|---|
| 8,300,423 B1 | 10/2012 | Darveaux et al. |
| 8,552,567 B2 | 10/2013 | England et al. |
| 8,674,494 B2 | 3/2014 | Nam et al. |
| 9,490,222 B1* | 11/2016 | Awujoola ............... H01L 23/552 |
| 2001/0042776 A1* | 11/2001 | Lo ........................ B23K 20/004 228/180.5 |
| 2002/0105077 A1* | 8/2002 | Choi ....................... H01L 23/50 257/738 |
| 2004/0137702 A1* | 7/2004 | Iijima .................... H01L 21/78 438/463 |
| 2005/0258545 A1 | 11/2005 | Kwon |
| 2012/0080806 A1* | 4/2012 | Song ....................... H01L 22/32 257/777 |
| 2013/0270682 A1 | 10/2013 | Hu et al. |
| 2014/0141566 A1 | 5/2014 | Schuetz |
| 2014/0369042 A1* | 12/2014 | Hsu ........................ F21V 23/00 362/249.01 |
| 2015/0048491 A1 | 2/2015 | Tan |
| 2015/0054169 A1 | 2/2015 | Lee |
| 2016/0148965 A1* | 5/2016 | Clayton ............ H01L 27/14634 257/293 |

FOREIGN PATENT DOCUMENTS

| | | |
|---|---|---|
| TW | 201248827 | 12/2012 |
| TW | 201347139 | 11/2013 |
| TW | 201438159 | 10/2014 |

* cited by examiner

METHOD OF FORMING PACKAGE STRUCTURE WITH DUMMY PADS FOR BONDING

CROSS-REFERENCE TO RELATED APPLICATION

This application claims the priority benefit of Taiwan application serial no. 104133820, filed on Oct. 15, 2015. The entirety of the above-mentioned patent application is hereby incorporated by reference herein and made a part of this specification.

BACKGROUND OF THE INVENTION

1. Field of the Invention

The invention relates to a semiconductor structure and a manufacturing method thereof, and particularly relates to a package structure and a manufacturing method thereof.

2. Description of Related Art

The electronic devices nowadays heavily rely on circuit boards where semiconductor dies or integrated circuits (ICs) are disposed. Mechanical and electrical connections between dies and substrates constantly bring challenges to IC designers. Wire bonding is one of the techniques that are commonly used to connect the ICs and substrates.

Figure 1:
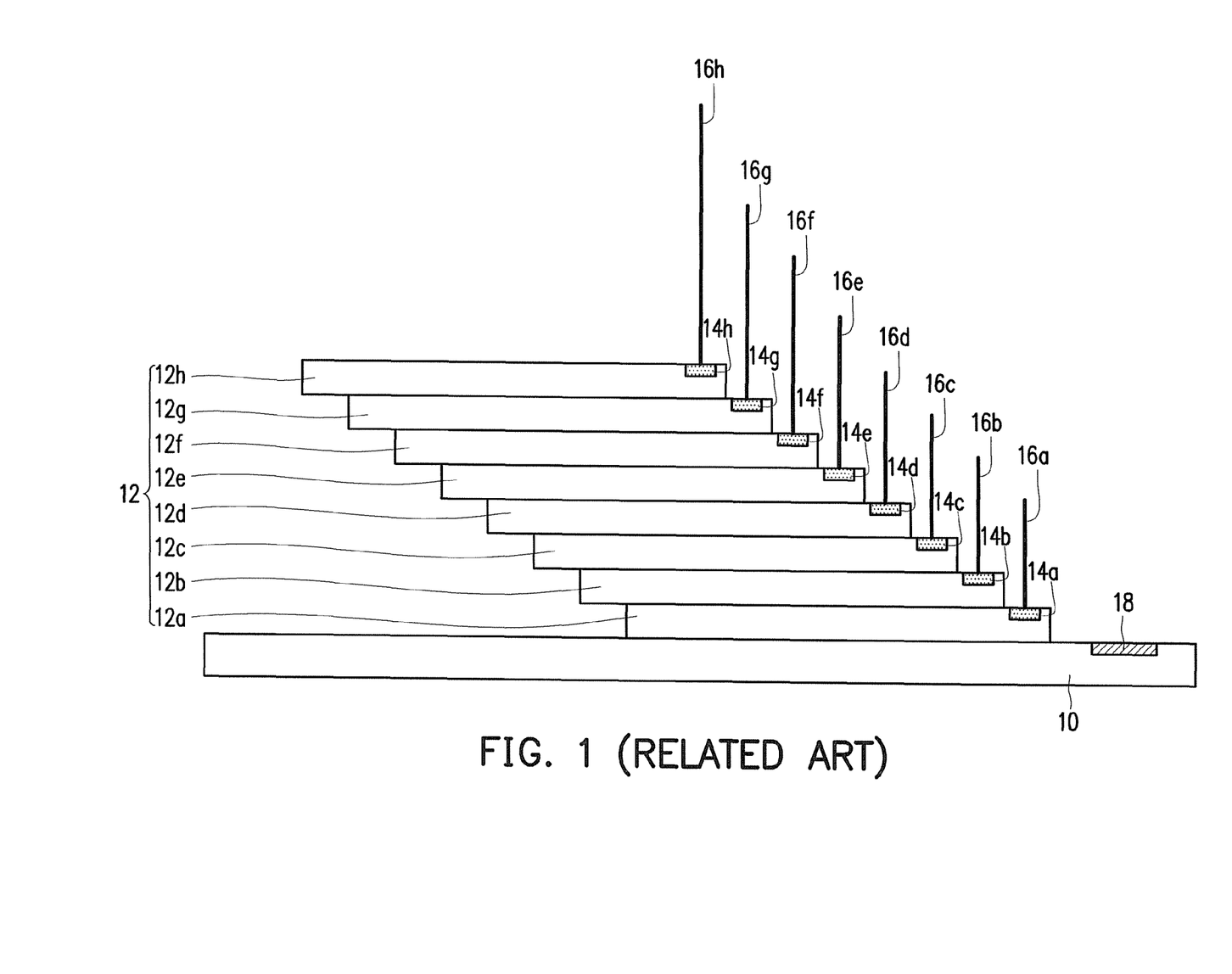
FIG. 1 is a schematic view illustrating a conventional package structure.

FIG. 1 is a schematic view illustrating a conventional package structure. The structure includes a substrate 10, a multi-die stack structure 12, a plurality of first pads 14a to 14h, vertical wires 16a to 16h, and a second pad 18. The multi-die stack structure 12 includes, from bottom to top, dies 12a to 12h vertically stacked on the substrate 10. The die 12a is a bottom die, whereas the die 12h is a top die. The first pads 14a to 14h are respectively disposed on an active surface of the corresponding dies 12a to 12h. The vertical wires 16a to 16h are respectively disposed on the corresponding first pads 14a to 14h. The second pad 18 is disposed on a surface of the substrate 10 at a side of the multi-die stack structure 12.

In a process of forming the vertical wires 16a to 16h, a distance from the top die 12h to the second pad 18 is longer than a distance from the bottom die 12a to the second pad 18. Accordingly, a length of the vertical wire 16h is also greater than a length of the vertical wire 16a. The higher the vertical wire 16h disposed on the top die 12h, the more likely a wire sweep may be resulted in. To prevent the higher vertical wire 16h from being pressed and damaged by a sealant mold chase afterwards, a depth of a cavity needs to be increased, making a polishing cost increase as well.

SUMMARY OF THE INVENTION

The invention provides a package structure and a manufacturing method thereof capable of reducing a length of a vertical wire and reducing a risk of a wire sweep. Thus, a subsequent molding process may be performed more conveniently, and a polishing cost is reduced.

The invention provides a package structure, including a substrate, N dies, N first pads, N vertical wires, and a second pad. The N dies are stacked alternately on the substrate to form a multi-die stack structure. The N dies include, from bottom to top, first to $N^{th}$ dies. The first die is a bottom die, the $N^{th}$ die is a top die, and N is an integer greater than 1. The N first pads are respectively disposed on an active surface of the dies. The N vertical wires are respectively disposed on the first pads. The second pad is disposed on the top die.

The invention provides a package structure, including a substrate, a plurality of first dies, a plurality of pads, and a plurality of vertical wires. The plurality of first dies are stacked alternately on the substrate to form a multi-die stack structure. Each of the first dies has a first region, a second region, and a third region. The second region is disposed between the first region and the third region, and the third region of the first die is a portion of a scribe line. The plurality of pads are respectively disposed on an active surface of the second region of the first dies. The plurality of vertical wires are respectively disposed on the pads.

The invention provides a manufacturing method of a package structure. The method includes steps as follows. A substrate is provided. A multi-die stack structure is formed on the substrate. The multi-die stack structure includes N dies stacked alternately. The N dies include, from bottom to top, first to $N^{th}$ dies. The first die is a bottom die, the $N^{th}$ die is a top die, and N is an integer greater than 1. N first pads are respectively formed on an active surface of the dies. A second pad is formed on the top die. N vertical wires are respectively formed on the first pads by performing a vertical wire bonding process.

Based on above, according to the embodiments of the invention, the second pad disposed on the top die and at least one third pad disposed on any die may serve as a dummy pad for wire cutting. Accordingly, the lengths of the vertical wires may be reduced, so as to reduce the risk of having a wire sweep. Thus, the subsequent molding process may be performed more conveniently and the polishing cost may also be reduced. In addition, the second pad and the third pad according to the embodiments of the invention may also protect the die therebelow, so as to be subjected to multiple wire bonding processes. Furthermore, according to the embodiments of the invention, by increasing the width of the scribe line, a portion of the scribe line may serve as a dummy pad for wire cutting.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Details of the invention are more thoroughly described with reference to the drawings of the embodiments. However, the invention may be implemented in different forms and shall not be construed as being limited to the embodiments of the invention. Thicknesses of layers and regions in the drawings may be enlarged for clearer illustration. Also, like or similar reference symbols represent like or similar components, and details of like or similar components are not repeated in the description.

Figure 2:
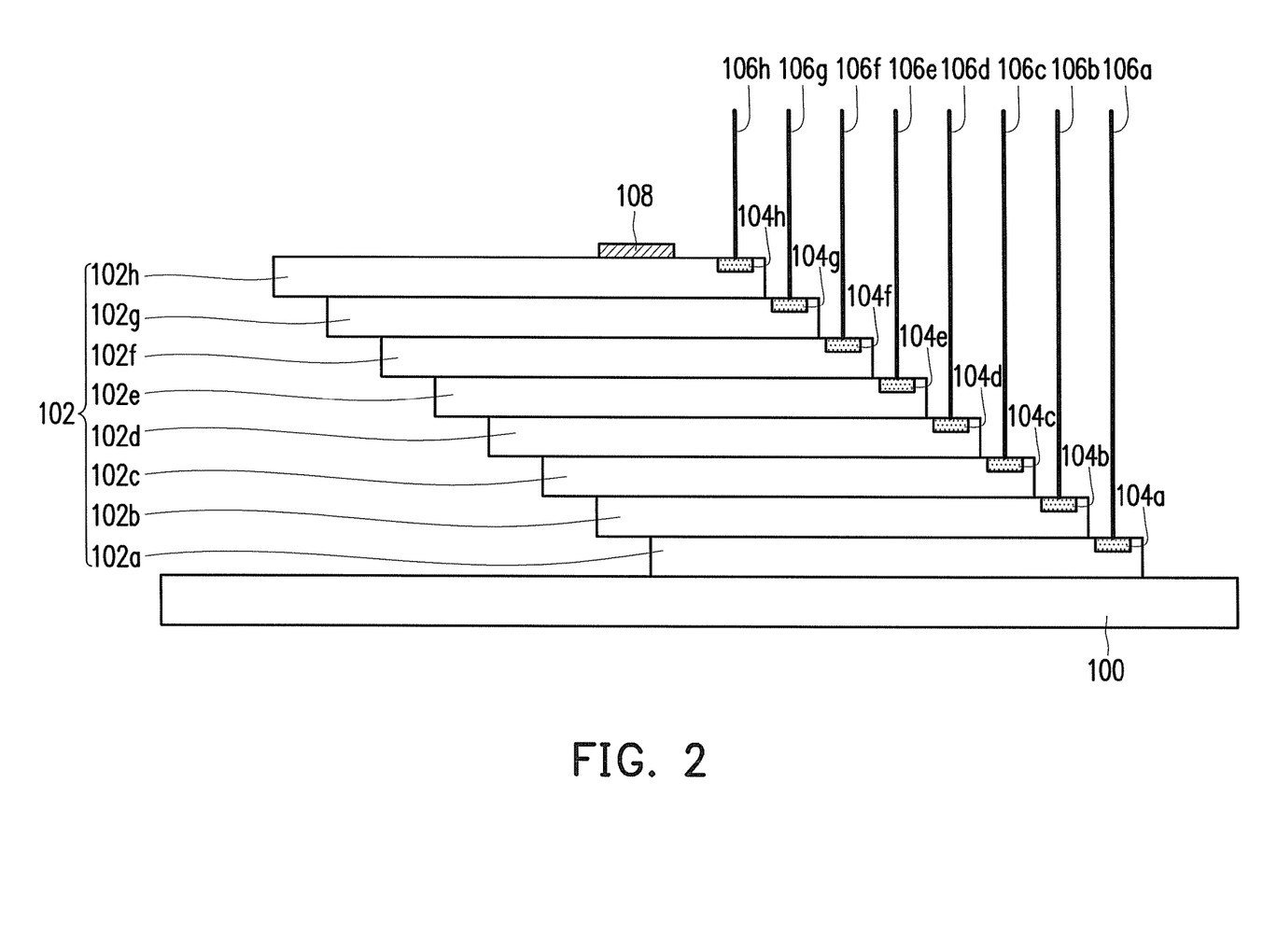
FIG. 2 is a schematic view illustrating a package structure according to a first embodiment of the invention.

FIG. 2 is a schematic view illustrating a package structure according to a first embodiment of the invention.

Referring to FIG. 2, the package structure of this embodiment includes a substrate 100, a multi-die stack structure 102, a plurality of first pads 104a to 104h, a plurality of vertical wires 106a to 106h, and a second pad 108. The multi-die stack structure 102 includes a plurality of dies 102a to 102h stacked alternately on the substrate 100. In this embodiment, the substrate 100 may be a printed circuit board, a silicon substrate, or a semiconductor substrate, for example.

The dies 102a to 102h include, from bottom to top, the first die 102a to the eighth die 102h. The first die 102a may be a bottom die, for example, and the eighth die 102h may be a top die, for example. In an embodiment, the multi-die stack structure 102 may be a step-like stack structure, for example. In an embodiment, the dies 102a to 102h may be dies having the same or different functions. However, the invention is not limited thereto. Also, even though FIG. 2 only shows eight dies, eight first pads and eight vertical wires, the invention is not limited thereto. The numbers of the dies, the first pads, and the vertical wires of the invention may be adjusted based on practical needs.

The first pads 104a to 104h are respectively disposed on an active surface of the dies 102a to 102h. More specifically, the first pad 104a is disposed on the active surface of the die 102a, the first pad 104b is disposed on the active surface of the die 102b, and so on so forth. Thus, details in this respect will not be repeated in the following. In an embodiment, a material of the first pads 104a to 104h includes a metal material, and the metal material may be copper, aluminum, gold, silver, nickel, palladium, or a combination thereof, for example.

The vertical wires 106a to 106h are respectively disposed on the first pads 104a to 104h. More specifically, the vertical wires 106a to 106h include, from bottom to top, the first vertical wire 106a to the eighth vertical wire 106h. The first vertical wire 106a is disposed on the first pad 104a, the second vertical wire 106b is disposed on the first pad 104b, and so on so forth. Details in this respect may be construed through inference and will not be repeated in the following. In an embodiment, a material of the vertical wires 106a to 106h includes a metal material, and the metal material may be copper, aluminum, gold, silver, nickel, palladium, or a combination thereof, for example. In an embodiment, the material of the vertical wires 106a to 106h may be the same or different from the material of the first pads 104a to 104h.

It should be noted that a length of the first vertical wire 106a is greater than a length of the eighth vertical wire 106h in this embodiment. Since the first vertical wire 106a is disposed on the first pad 104a of the lowermost bottom die 102a, whereas the eighth vertical wire 106h is disposed on the first pad 104h of the uppermost top die 102h, heights of terminals of the vertical wires 106a to 106h in this embodiment are relatively similar or identical to each other as compared with conventional vertical wires shown in FIG. 1. Accordingly, the vertical wires 106a to 106 of this embodiment may be less likely to have a wire sweep. A subsequent molding process may be performed more conveniently and a polishing cost may be reduced. Even though FIG. 2 shows that the heights of the terminals of the vertical wires 106a to 106h are the same, the invention is not limited thereto. The heights of the terminals of the vertical wires 106a to 106h may also be different to a certain extent.

The second pad 108 is disposed on the top die 102h. In an embodiment, a material of the second pad 108 is different from the material of the first pads 104a to 104h. In an embodiment, the material of the second pad 108 includes a silicon material, a semiconductor material, a metal material, a die-bonding material, an insulating material, an electrically resistive material, or a combination thereof, and the metal material may be copper, aluminum, gold, silver, nickel, palladium, or a combination thereof, for example. The die-bonding material may be a die attach film (DAF), for example, and the insulating material may be polyimide (PI), for example.

Figure 3A:
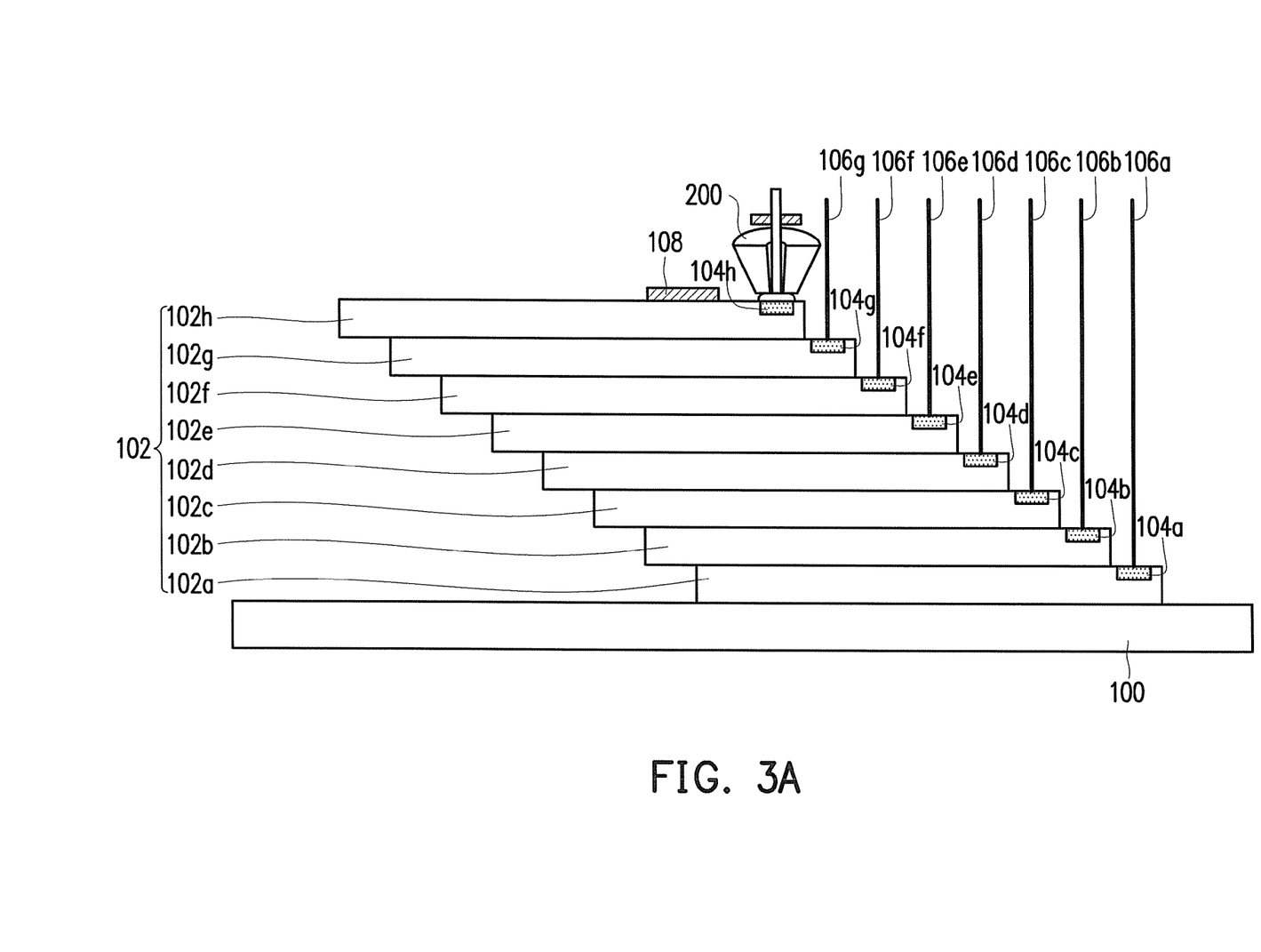
FIGS. 3A to 3C are schematic views illustrating a manufacturing process of the package structure shown in FIG. 2.
Figure 3B:
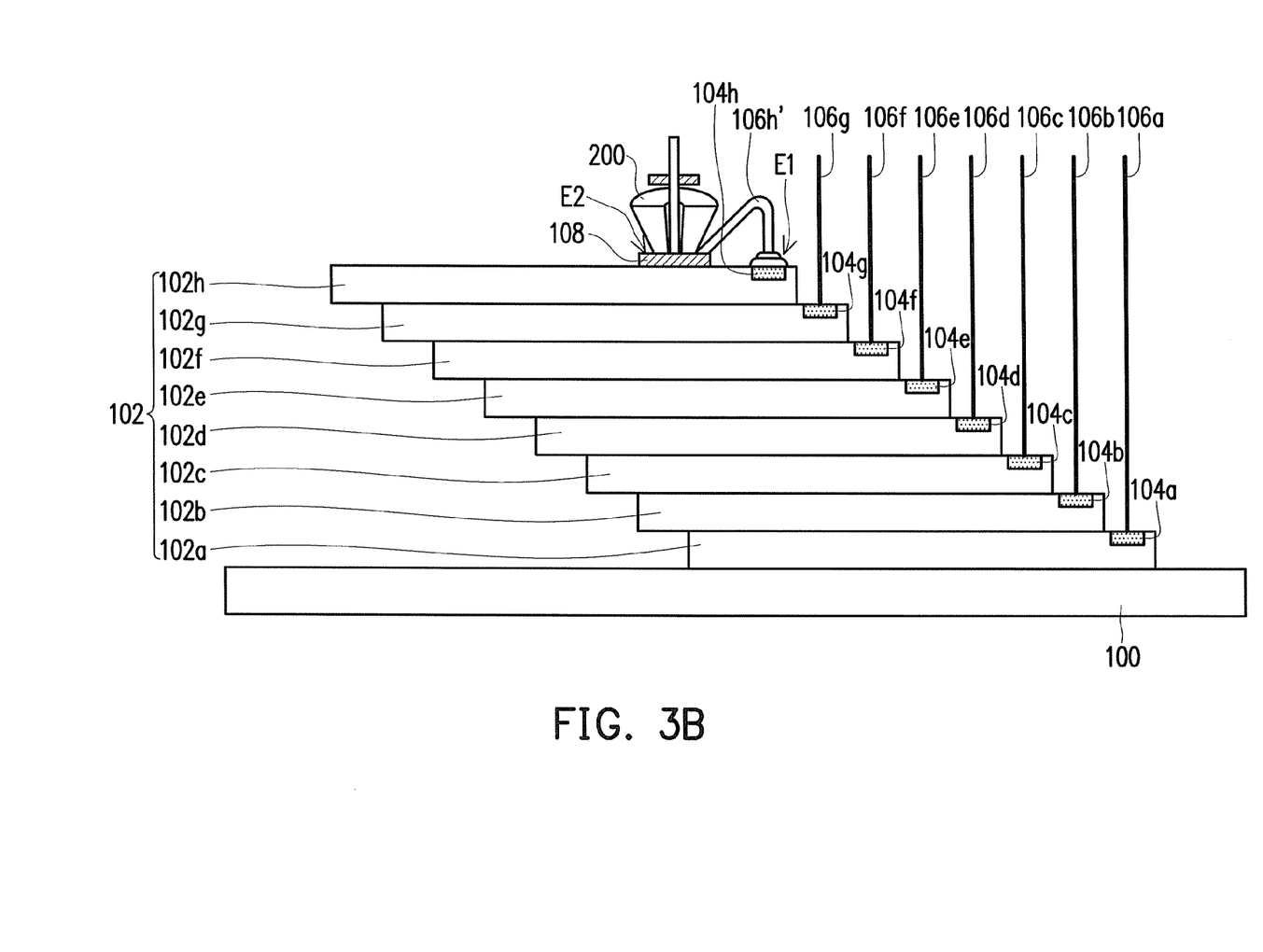
Figure 3C:
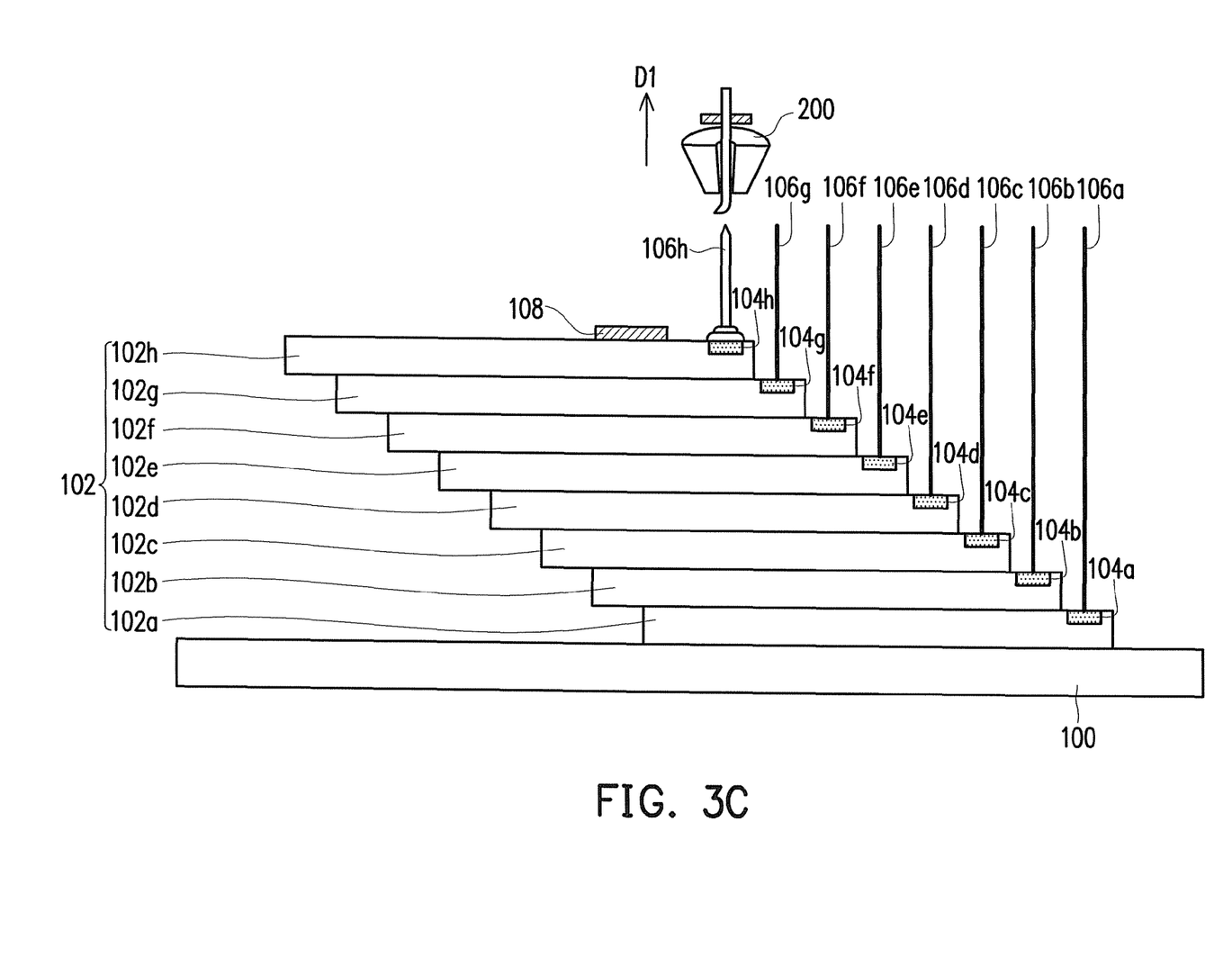

FIGS. 3A to 3C are schematic views illustrating a manufacturing process of the package structure shown in FIG. 2.

Referring to FIG. 3A, the manufacturing method of the package structure according to the embodiment of the invention includes steps as follows. First of all, the substrate 100 is provided. Then, the multi-die stack structure 102 is formed on the substrate 100. The multi-die stack structure 102 includes the plurality of dies 102a to 102h stacked alternately. The dies 102a to 102h include, from bottom to top, the first die 102a to the eighth die 102h. The first die 102a may be the bottom die, for example, and the eighth die 102h may be the top die, for example. Then, the first pads 104a to 104h are respectively formed on the active surface of the dies 102a to 102h. The second pad 108 is formed on the top die 102h. Then, by performing a vertical wire bonding process, the plurality of vertical wires 106a to 106h are respectively formed on the first pads 104a to 104h.

More specifically, steps of the vertical wire bonding process are described as follows by using the vertical wire 106h as an example.

Referring to FIGS. 3A and 3B together, by using a wire bonding machine 200, a first end E1 of a vertical wire 106h' is firstly bonded to the first pad 104h. Then, by using the wire bonding machine 200, a second end E2 of the vertical wire 106h' is pulled to the second pad 108 and pressed. At this time, the second end E2 of the vertical wire 106h' is slightly deformed but not cut off. In this embodiment, the material of the second pad 108 is different from the material of the first pads 104a to 104h, and an adhesion force of the vertical wire 106h' to the second pad 108 and an adhesion force to the first pads 104a to 104h are different, too. Therefore, the first end E1 of the vertical wire 106h' may be bonded to the first pad 104h, and the second end E2 of the vertical wire 106h' is not bonded to the second pad 108. In this embodiment, the second pad 108 may serve as a dummy pad for wire cutting.

Also, referring to FIG. 3C, by using the wire bonding machine 200, the second end E2 of the vertical wire 106h' is pulled in a direction D1 away from the substrate 100, so as to cut off the vertical wire 106h'. More specifically, by pressing, the second end E2 of the vertical wire 106h' is already deformed. Then, by using a pulling force of the wire bonding machine 200, the vertical wire 106h' may be cut off at the second end E2.

It should be noted that, in this embodiment, the second pad 108 disposed on the top die 102h may serve as a dummy pad for wire cutting. Accordingly, in this embodiment, the lengths of the vertical wires 106a to 106h may be reduced, so as to reduce a risk of having a wire sweep. Thus, the subsequent molding process may be performed more conveniently and the polishing cost may also be reduced. Besides, the second pad 108 according to the embodiments of the invention may also protect the top die 102h therebelow, so as to be subjected to multiple wire bonding processes.

After respectively forming the vertical wires 106a to 106h on the first pads 104a to 104h by performing the vertical wire bonding process, the embodiment further includes a molding process. In addition, the vertical wires 106a to 106h are electrically connected to a redistribution layer (RDH) or a package substrate, so as to form a package structure (not shown). Then, the package structure is electrically connected to another package structure (not shown) through a bump or a solder ball.

Figure 4:
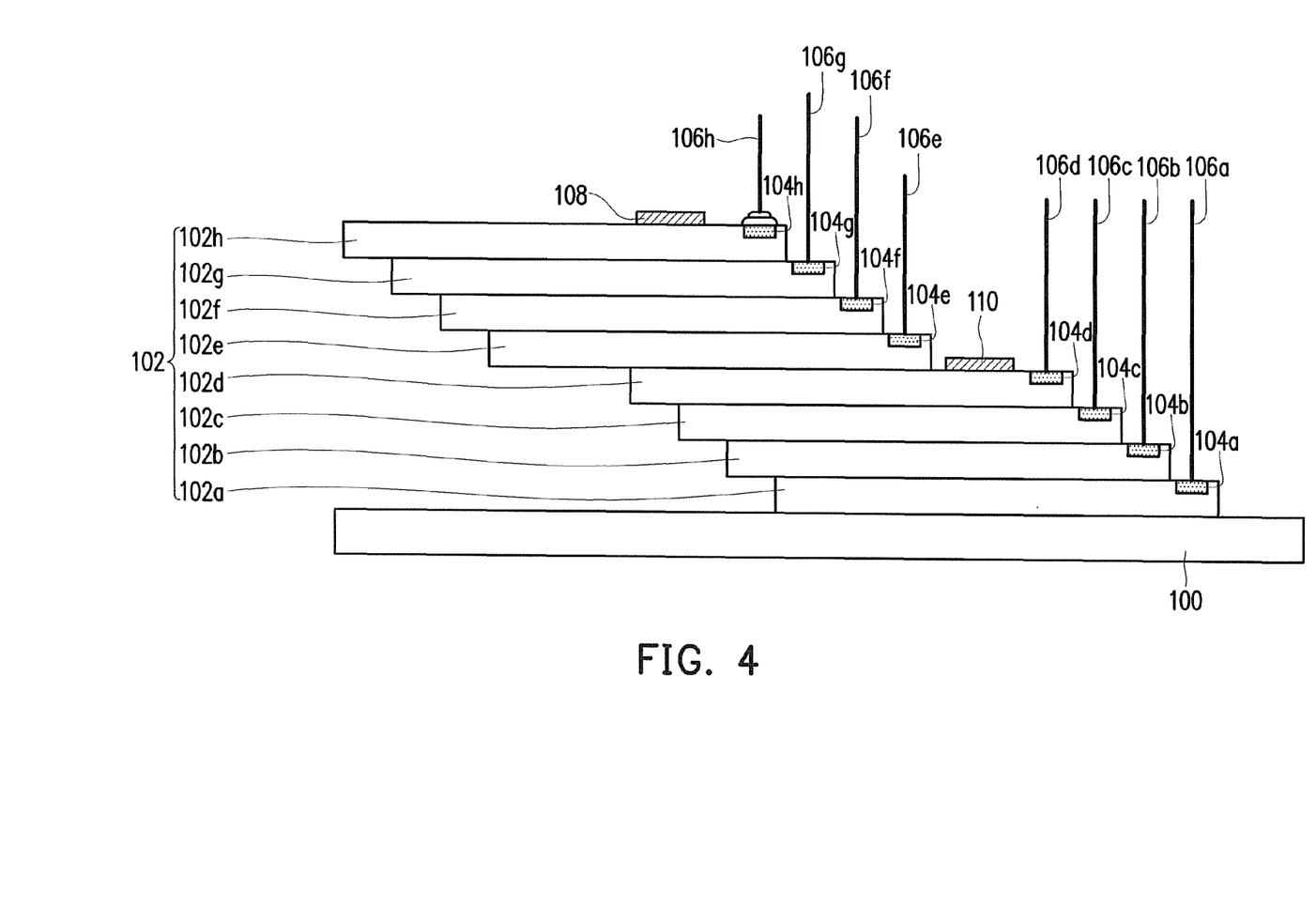
FIG. 4 is a schematic view illustrating a package structure according to a second embodiment of the invention.

FIG. 4 is a schematic view illustrating a package structure according to a second embodiment of the invention.

Referring to FIG. 4, the package structure of the second embodiment is similar to the package structure of the first embodiment, except for a main difference that the package structure of the second embodiment includes at least one third pad 110 disposed on the die 102d. The third pad 110 is disposed between a side of the die 102e and the vertical wire 106d of the die 102d. The third pad 110 may also serve as a dummy pad for wire cutting. Also, the third pad 110 may protect the die 102d therebelow, so as to be subjected to multiple wire bonding processes. Even though FIG. 4 only illustrates one third pad 110, the invention is not limited thereto. In other embodiments, one or more third pads 110 may be respectively disposed on any die between the bottom die and the top die. In an embodiment, a material of the third pad 110 is different from the material of the first pads 104a to 104h. In an embodiment, the material of the third pad 110 includes a silicon material, a semiconductor material, a metal material, a die-bonding material, an insulating material, an electrically resistive material, or a combination thereof, and the metal material may be copper, aluminum, gold, silver, nickel, palladium, or a combination thereof, for example. The die-bonding material may be a die attach film (DAF), for example. The insulating material may be polyimide (PI), for example.

Figure 5:
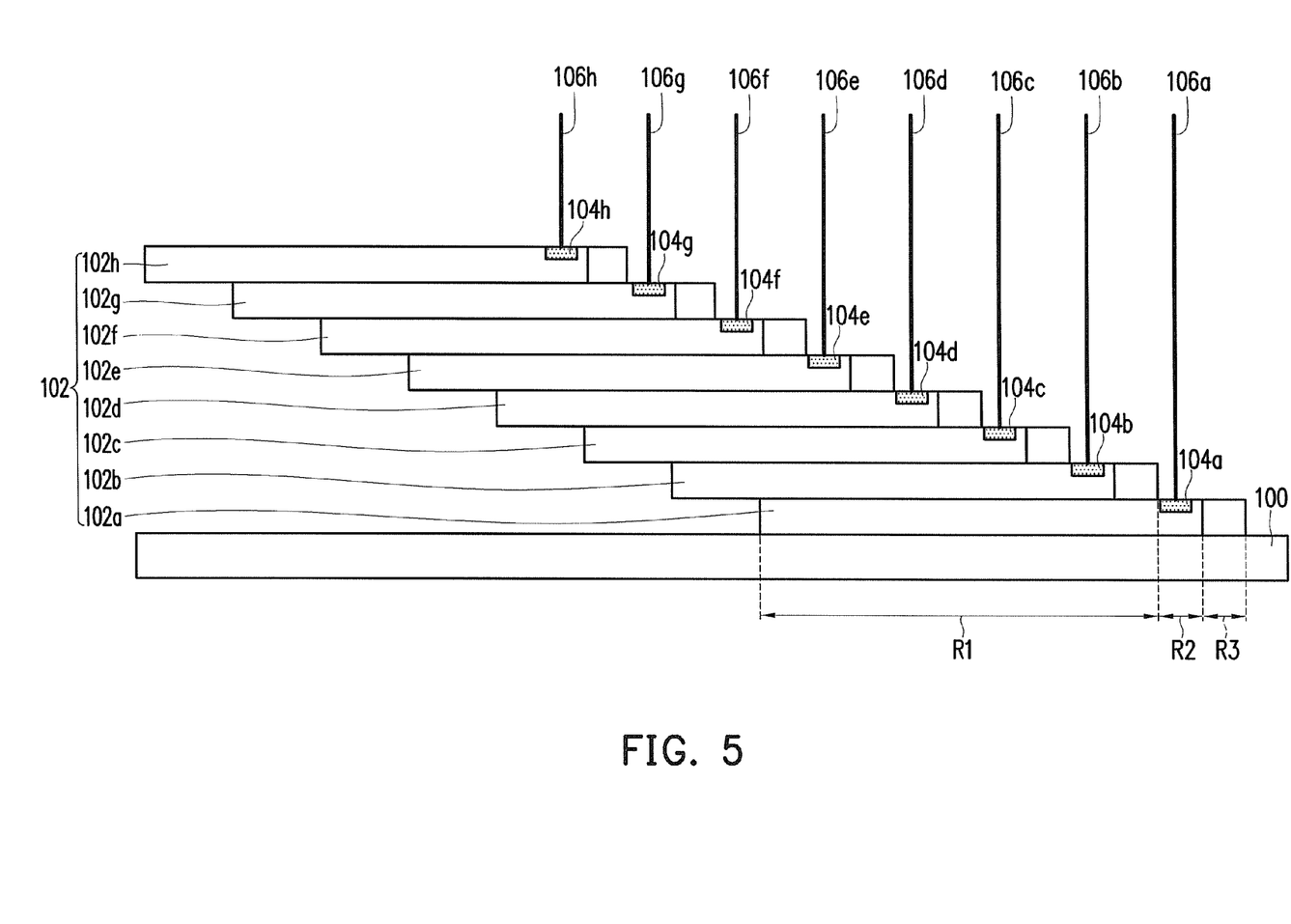
FIG. 5 is a schematic view illustrating a package structure according to a third embodiment of the invention.

FIG. 5 is a schematic view illustrating a package structure according to a third embodiment of the invention.

Referring to FIG. 5, the package structure of the third embodiment is similar to the package structure of the first embodiment, except for a main difference that the package structure of the third embodiment does not include the second pad 108 disposed on the top die 102h. More specifically, each of the dies 102a to 102h includes a first region R1, a second region R2, and a third region R3 of the third embodiment. The second region R2 is disposed between the first region R1 and the third region R3. An upper die may be disposed on the first region of a lower die, so as to form the step-like stack structure. For example, the die 102b is disposed on the first region R1 of the die 102a, so as to expose a surface of the die 102a in the second region R2 and the third region R3. The same arrangement applies to rest of the dies and may be construed through inference. Thus, details in this respect will not be repeated in the following.

It should be noted that the third region R3 of the dies 102a to 102h may be a part of a scribe line, for example. The material of the first pads 104a to 104h is different from a material of the dies 102a to 102h, and the adhesion forces of the vertical wires 106a to 106h to the dies 102a to 102h and to the first pads 104a to 104 of the third embodiment are different, too. Therefore, the third region R3 of the dies 102a to 102h of the third embodiment may serve as a dummy pad for wire cutting. In an embodiment, the material of the dies 102a to 102h may be a silicon material, a semiconductor material, an insulating material, or a combination thereof. In an embodiment, a width of the third region R3 may be in a range from 250 μm to 500 μm. However, the invention is not limited thereto. In other embodiments, the width of the third region R3 may also be less than 250 μm or greater than 500 μm.

Figure 6:
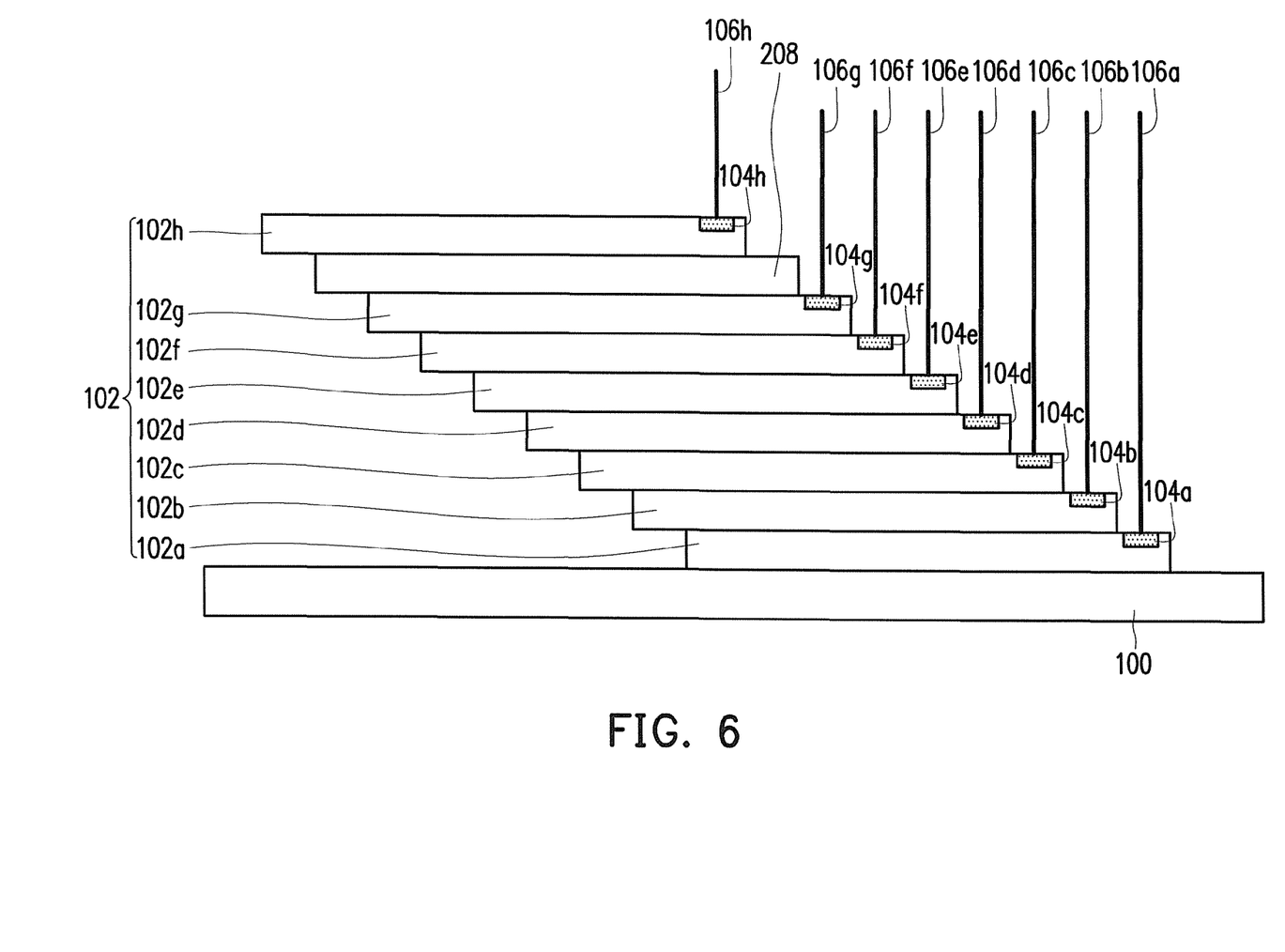
FIG. 6 is a schematic view illustrating a package structure according to a fourth embodiment of the invention.

FIG. 6 is a schematic view illustrating a package structure according to a fourth embodiment of the invention.

Referring to FIG. 6, the package structure of the fourth embodiment is similar to the package structure of the first embodiment, except for a main difference that the package structure of the fourth embodiment further includes a die 208 disposed between the die 102g and the die 102h. However, the invention is not limited thereto. In other embodiments, the die 208 may be disposed between any adjacent dies 102a to 102h or on the die (top die) 102h. In addition, the die 208 that is disposed between any adjacent dies 102a to 102h or on the die (top die) 102h may serve as a dummy pad for wire cutting. Accordingly, in this embodiment, the die 208 at different heights may serve to adjust or control the lengths of the vertical wires 106a to 106h. In an embodiment, a material of the die 208 is different from the material of the first pads 104a to 104h. The material of the die 208 may be a silicon material, a semiconductor material, an insulating material, or a combination thereof, for example.

In view of the foregoing, according to the embodiments of the invention, the second pad disposed on the top die and at least one third pad disposed on any die may serve as a dummy pad for wire cutting. Accordingly, the lengths of the vertical wires may be reduced, so as to reduce the risk of having a wire sweep. Thus, the subsequent molding process may be performed more conveniently and the polishing cost may also be reduced. In addition, the second pad and the third pad according to the embodiments of the invention may also protect the die therebelow, so as to be subjected to multiple wire bonding processes. Furthermore, according to the embodiments of the invention, by increasing the width of the scribe line, a portion of the scribe line may serve as a dummy pad for wire cutting.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package structure, comprising:
    providing a substrate;
    forming a multi-die stack structure on the substrate, wherein the multi-die stack structure has N dies stacked in a step-like stack structure, the N dies comprise a first die to an $N^{th}$ die, the first die is a bottom die closest to the substrate, and the $N^{th}$ die is a top die, N being an integer greater than 1, wherein each of the N dies has an active surface and each active surface comprises at least one first pad formed thereon;
    forming at least one dummy pad on the multi-die stack structure; and
    forming a vertical wire on each of the at least one first pad of each of the N dies by performing a vertical wire bonding process, wherein a length of the vertical wire formed on the first pad of the bottom die is greater than a length of the vertical wire formed on the first pad of the top die.

2. The manufacturing method of the package structure as claimed in claim 1, wherein the vertical wire bonding process comprises:
   bonding a first end of the vertical wire to the first pad by using a wire bonding machine;
   pulling a second end of the vertical wire to the dummy pad and pressing the second end against the dummy pad using the wire bonding machine; and
   pulling the second end of the vertical wire in a direction away from the substrate using the wire bonding machine to detach the vertical wire from a wire of the wire bonding machine.

3. The manufacturing method of the package structure as claimed in claim 1, wherein the step of forming the at least one dummy pad on the multi-die stack structure comprises forming a dummy pad on the active surface of the top die.

4. The manufacturing method of the package structure as claimed in claim 1, wherein a material of the dummy pad comprises a silicon material, a semiconductor material, a metal material, a die-bonding material, an insulating material, an electrically resistive material, or a combination thereof.

5. The manufacturing method of the package structure as claimed in claim 1, wherein the step of forming the at least one dummy pad on the multi-die stack structure comprises:
   forming a dummy pad on the active surface of the top die; and
   forming another dummy pad on an active surface of a die between the top die and the bottom die.

6. The manufacturing method of the package structure as claimed in claim 1, wherein the step of forming the at least one dummy pad on the multi-die stack structure comprises inserting a die between the top die and the bottom die to serve as a dummy pad.

7. The manufacturing method of the package structure as claimed in claim 1, wherein the step of forming the at least one dummy pad on the multi-die stack structure comprises retaining a scribe line in at least one of the N dies to serve as a dummy pad.

* * * * *